United States Patent
Hayakawa (10) Patent No.: US 8,344,799 B2
(45) Date of Patent: Jan. 1, 2013

(54) POWER AMPLIFIER AND AMPLIFICATION METHOD THEREOF

(75) Inventor: Makoto Hayakawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/123,944

(22) PCT Filed: Oct. 6, 2009

(86) PCT No.: PCT/JP2009/005187
§ 371 (c)(1),
(2), (4) Date: Apr. 13, 2011

(87) PCT Pub. No.: WO2010/052825
PCT Pub. Date: May 14, 2010

(65) Prior Publication Data
US 2011/0199156 A1    Aug. 18, 2011

(30) Foreign Application Priority Data
Nov. 5, 2008    (JP) .................. 2008-283806

(51) Int. Cl.
*H03F 3/68*    (2006.01)
(52) U.S. Cl. ............. 330/124 R; 330/136; 330/295
(58) Field of Classification Search .......... 330/295, 330/124 R, 136, 127, 286
See application file for complete search history.

(56) References Cited

U.S. PATENT DOCUMENTS
5,757,229 A * 5/1998 Mitzlaff ............... 330/124 R

FOREIGN PATENT DOCUMENTS
| JP | 2002314345 A | 10/2002 |
| JP | 2007053540 A | 3/2007 |
| JP | 2007081800 A | 3/2007 |
| JP | 2008078847 A | 4/2008 |
| JP | 2008147857 A | 6/2008 |

OTHER PUBLICATIONS
International Search Report for PCT/JP2009/005187 mailed Dec. 22, 2009.

* cited by examiner

*Primary Examiner* — Hieu Nguyen (57) ABSTRACT

A power amplifier according to the present invention includes: a carrier amplifier (2) that amplifies a carrier of a high-frequency input signal; a peak amplifier (3) that amplifies a peak component of the high-frequency input signal; an average power level detecting circuit (11) that detects an average power level of the high-frequency input signal; a peak power level detecting circuit (12) that detects a peak power level of the high-frequency input signal; a first voltage controller (10a) that controls a DC voltage supplied to the carrier amplifier (2) according to an output voltage signal from the average power level detecting circuit (11); and a second voltage controller (10b) that controls a DC voltage supplied to the peak amplifier (3) according to an output voltage signal from the peak power level detecting circuit (12).

14 Claims, 8 Drawing Sheets

POWER AMPLIFIER AND AMPLIFICATION METHOD THEREOF

TECHNICAL FIELD

The present invention relates to a power amplifier and an amplification method thereof, and more particularly, to a power amplifier with a Doherty amplifier configuration for amplifying a signal having a relatively high peak amplitude, such as W-CDMA (Wideband-Code Division Multiple Access) or OFDMA (Orthogonal Frequency Division Multiple Access) modulation wave, and an amplification method thereof.

BACKGROUND ART

There is an increasing demand for reduction in power consumption (high efficiency) in transmission power amplifiers for cellular phone base stations. As a matter of course, the reduction in power consumption is effective not only in reducing an environmental load by saving electricity costs or energy, but also in reducing the surface area of a radiator plate necessary for heat radiation, because of a reduction in calorific power of power amplifiers. This results in an effect of allowing the volume of each transmission power amplifier to be made relatively small.

To improve the efficiency of transmission power amplifiers, Doherty amplifiers are typically used (see Patent Literature 1, for example). A Doherty amplifier includes a carrier amplifier that performs a signal amplification operation constantly, and a peak amplifier that operates only at the time of high power output. The Doherty amplifier has a configuration in which an input signal is distributed to the carrier amplifier and the peak amplifier, and outputs of the carrier amplifier and the peak amplifier are combined.

Figure 6:
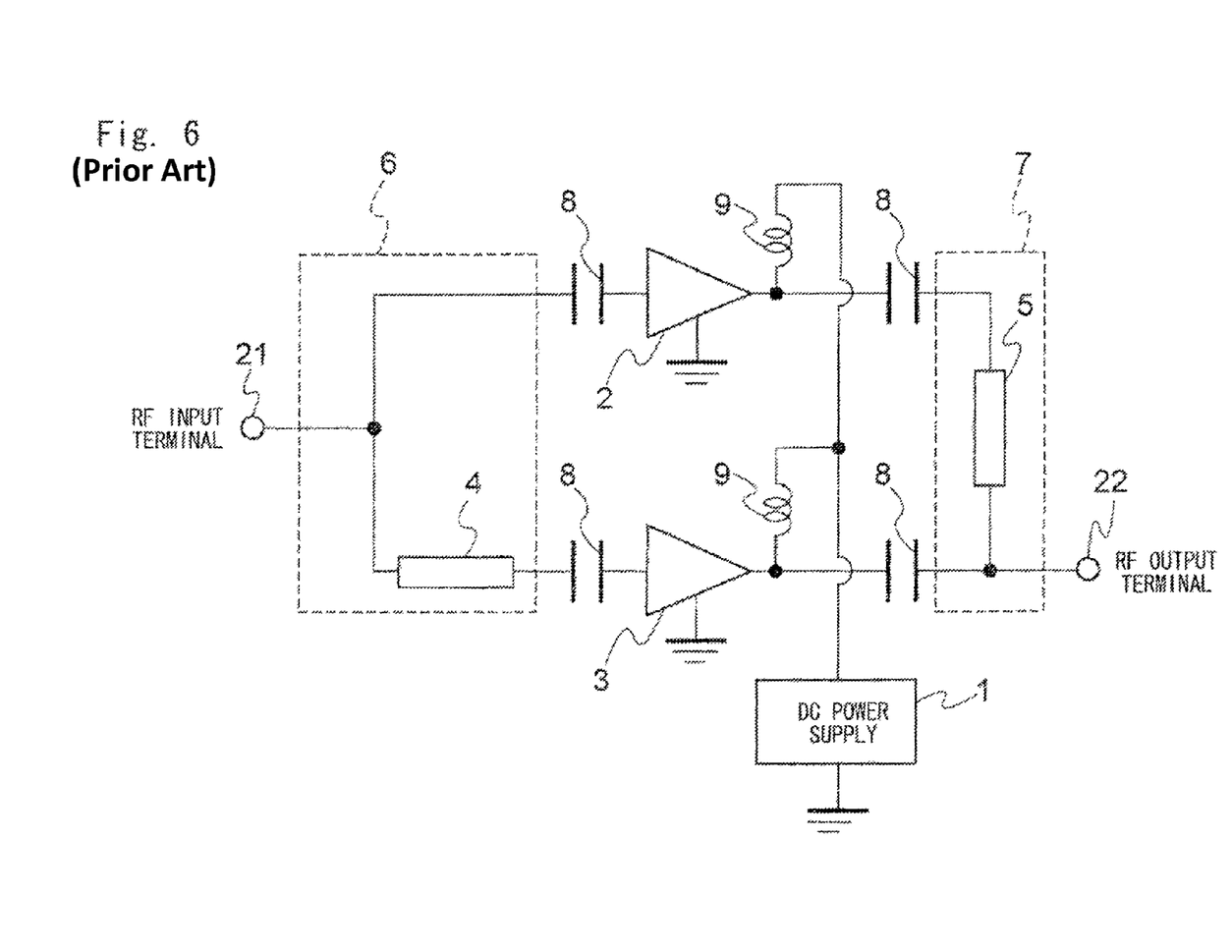
FIG. 6 is a block diagram showing an exemplary power amplifier with a Doherty amplifier configuration.

FIG. 6 is a block diagram showing an exemplary power amplifier with a Doherty amplifier configuration. Referring to FIG. 6, the power amplifier includes an input branch circuit 6, DC (Direct Current) decoupling capacitors 8, a carrier amplifier 2, and a peak amplifier 3.

The power amplifier also includes RF (Radio Frequency) choke coils 9, a DC power supply 1, an output combiner circuit 7, an RF input terminal 21, and an RF output terminal 22. Further, the input branch circuit 6 includes a ¼ wavelength transmission line 4, and the output combiner circuit 7 includes a ¼ wavelength transmission line 5.

As the carrier amplifier 2 and the peak amplifier 3, field effect transistors (FET) are used, for example. The output combiner circuit 7, which is formed of a transformer, is typically composed of the ¼ wavelength transmission line 5. The input branch circuit 6 is composed of the ¼ wavelength transmission line 4 or a 90-degree hybrid circuit, for example, which causes output signals of the carrier amplifier 2 and the peak amplifier 3 to be in phase at a signal combining point of the output combiner circuit 7.

A common power supply voltage from the DC power supply 1 is supplied to each of the carrier amplifier 2 and the peak amplifier 3 through the RF choke coil 9. As the DC decoupling capacitors 8, capacitances having a sufficiently low impedance at the frequency of an RF signal to be used are selected. In general, the carrier amplifier 2 is based to AB-class or B-class, and the peak amplifier 3 is biased to C-class. The power amplifier includes the carrier amplifier 2 that operates while being saturated in the vicinity of a saturated output power. Accordingly, an efficiency higher than that of a normal A-class or AB-class amplifier is realized even when the saturated output power backs off.

Figure 7:
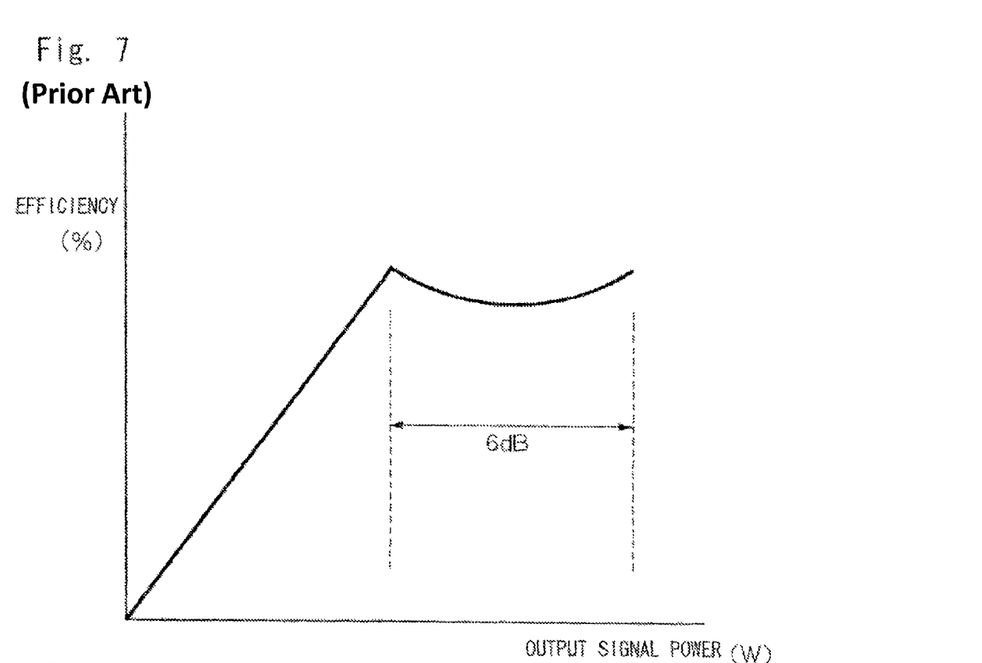
FIG. 7 is a graph showing an example of efficiency versus output signal power characteristics of the power amplifier with the Doherty amplifier configuration shown in FIG. 6.
Figure 8:
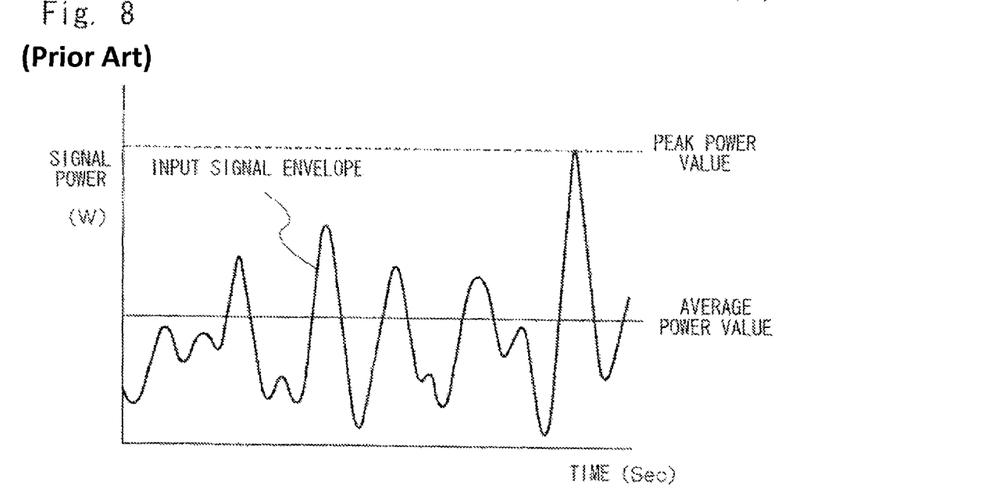
FIG. 8 is a signal power versus time characteristic diagram showing a relationship between a peak power value and an average power value of an RF signal.

FIG. 7 is a graph showing an example of efficiency versus output signal power characteristics of the power amplifier with a Doherty amplifier configuration shown in FIG. 6. FIG. 7 shows that when the saturated output levels of the carrier amplifier and the peak amplifier are the same, the power amplifier has efficiency peaks at a 6 dB backoff point where the carrier amplifier is saturated and at a 0 dB backoff point where the peak amplifier is also saturated, with respect to the combined saturated outputs of the carrier amplifier and the peak amplifier. FIG. 8 is a signal power versus time characteristic diagram showing a relationship between a peak power value and an average power value of the RF signal.

Meanwhile, W-CDMA modulation wave and OFDMA modulation wave, which are used in recent mobile communication systems, have a relatively large peak factor (a ratio between an average power level and a peak power level of an input signal) of 7 dB to 11 dB. For this reason, it is necessary to set the operating point of each power amplifier in the range of 7 dB to 11 dB or higher. Accordingly, it is impossible to cause the power amplifier to operate at the efficiency peak point.

An example of means for solving such a problem is disclosed in Patent Literature 2. This supplies different power supply voltages to a carrier amplifier and a peak amplifier and changes the saturated output levels of the carrier amplifier and the peak amplifier, thereby allowing the efficiency peak point of a Doherty amplifier to change from 6 dB and to operate at a given operating point with a maximum efficiency. Further, Patent Literature 2 proposes a technique in which an input level detector and a voltage control unit are provided. When the input level is relatively low, a power supply voltage is set to be relatively low, and when the input level is relatively high, the power supply voltage is set to be relatively high, thereby optimizing the power supply voltage supplied to each of the carrier amplifier and the peak amplifier according to the input average signal power and maintaining the high efficiency.

Another example of the related Doherty amplifier is disclosed in Patent Literature 3. This amplifier has a configuration in which an input signal is branched by a directional coupler; the branched signals are further distributed by a distributor; an envelope of one of the distributed signals is detected by an envelope detector; and a bias voltage according to a peak/average power ratio is applied to a peak amplifier.

Still another example is disclosed in Patent Literature 4. In the technique disclosed in Patent Literature 4, input distribution means distributes an input signal and inputs one of the distributed signals to a detection circuit. Next, the detection circuit detects an envelope of the input signal and inputs the detected output to waveform forming means. Then, the waveform forming means outputs a signal corresponding to the envelope of an equivalent RF signal to each of voltage controllers 1 and 2. After that, the voltage controller 1 supplies a voltage corresponding to the signal from the waveform forming means to a carrier amplifier, and the voltage controller 2 supplies a voltage corresponding to the signal from the waveform forming means to a peak amplifier.

CITATION LIST

Patent Literature

[Patent Literature 1] Japanese Unexamined Patent Application Publication No. 2007-053540
[Patent Literature 2] Japanese Unexamined Patent Application Publication No. 2007-081800

[Patent Literature 3] Japanese Unexamined Patent Application Publication No. 2008-078847
[Patent Literature 4] Japanese Unexamined Patent Application Publication No. 2008-147857

SUMMARY OF INVENTION

Technical Problem

However, in the technique disclosed in Patent Literature 2 described above, it is difficult to constantly use the efficiency peak operating point of a Doherty amplifier in real time in the following cases. That is, when the W-CDMA modulation wave, OFDM modulation wave, and the like having different peak factors in one system need to be handled randomly; when, though the same modulation wave signal is handled, the number of signal carriers varies depending on the communication traffic state and the signal power level varies accordingly; and when the peak factor varies depending on the variation in the number of signal carriers.

Figure 9:
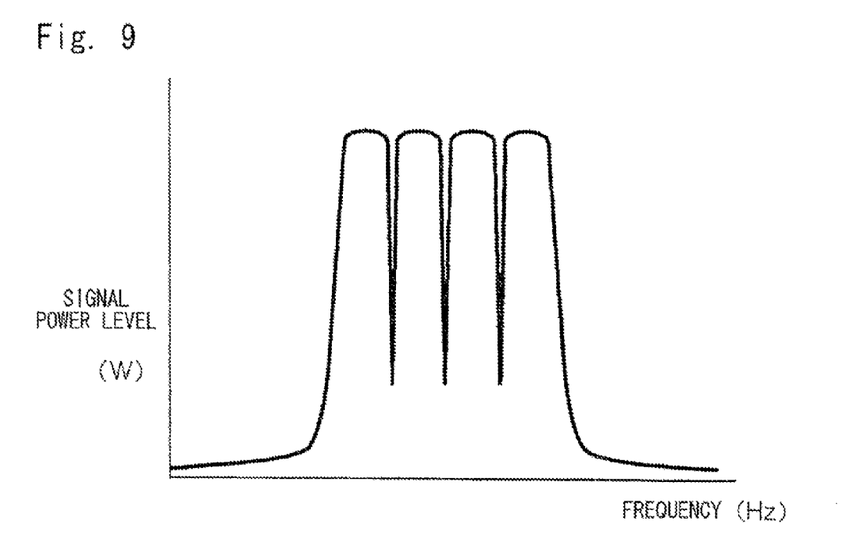
FIG. 9 is an example of a signal power level versus frequency characteristic diagram of a W-CDMA modulation wave system.
Figure 10:
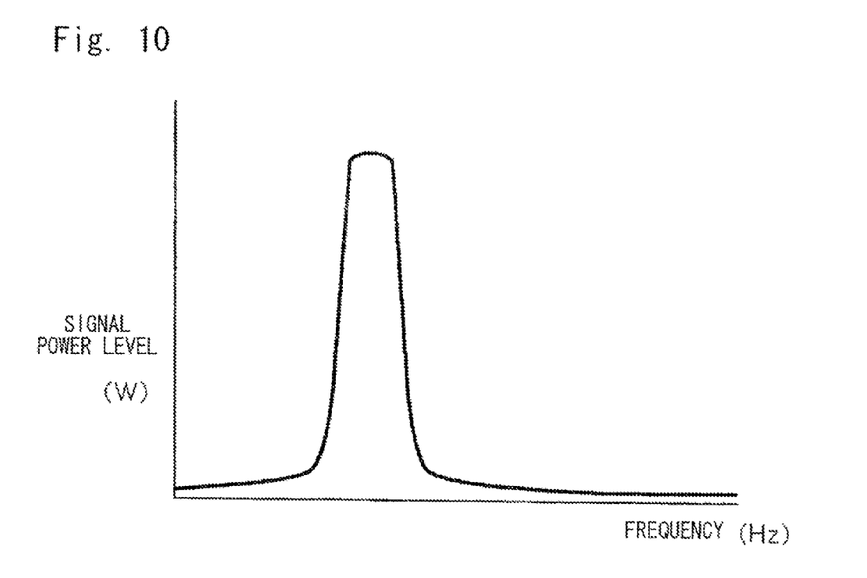
FIG. 10 is another example of the signal power level versus frequency characteristic diagram of the W-CDMA modulation wave system.

FIG. 9 is an example of signal power level versus frequency characteristic diagram of a W-CDMA modulation wave system. FIG. 10 is another example of the signal power level versus frequency characteristic diagram of the W-CDMA modulation wave system. In the case of a W-CDMA modulation wave system, for example, as shown in FIG. 9, the system may be run by using four carriers, or may be run by using one carrier as shown in FIG. 10 particularly when the amount of communication traffic is small, such as during night time. In the case of a system having a constant power level per carrier, the difference in signal power level between the time when four carriers are used and the time when one carrier is used is 6 dB which is relatively high. Accordingly, the power supply voltage of the carrier amplifier and the power supply voltage of the peak amplifier, which are optimized at the time of using four carriers, are redundant for the time of using one carrier, which inhibits the high efficiency.

Accordingly, in the power amplifier in which the signal level varies with time and modulated signals having different peak factors need to be amplified, it is necessary to make technical development for allowing the power amplifier to operate at the operating point of the optimum efficiency peak under any conditions.

Therefore, an object of the present invention is to provide a power amplifier capable of constantly operating with high efficiency without depending on the type of an input signal and an input signal power level, and an amplification method thereof.

Solution to Problem

In order to solve the above-mentioned problems, a power amplifier according to the present invention includes: a carrier amplifier that amplifies a carrier of a high-frequency input signal; a peak amplifier that amplifies a peak component of the high-frequency input signal; an average power level detecting circuit that detects an average power level of the high-frequency input signal; a peak power level detecting circuit that detects a peak power level of the high-frequency input signal; a first voltage controller that controls a DC voltage supplied to the carrier amplifier according to an output voltage signal from the average power level detecting circuit; and a second voltage controller that controls a DC voltage supplied to the peak amplifier according to an output voltage signal from the peak power level detecting circuit.

A power amplification method according to the present invention includes: detecting an average power level of a high-frequency input signal; detecting a peak power level of the high-frequency input signal; controlling a DC voltage supplied to a carrier amplifier that amplifies a carrier according to an output voltage signal detected when the average power level is detected; and controlling a DC voltage supplied to a peak amplifier that amplifies a peak component according to an output voltage signal detected when the peak power level is detected.

Advantageous Effects of Invention

According to the present invention, it is possible to obtain a power amplifier capable of operating with high efficiency without depending on the type of an input signal and an input signal power level, and an amplification method thereof.

DESCRIPTION OF EMBODIMENTS

Figure 1:
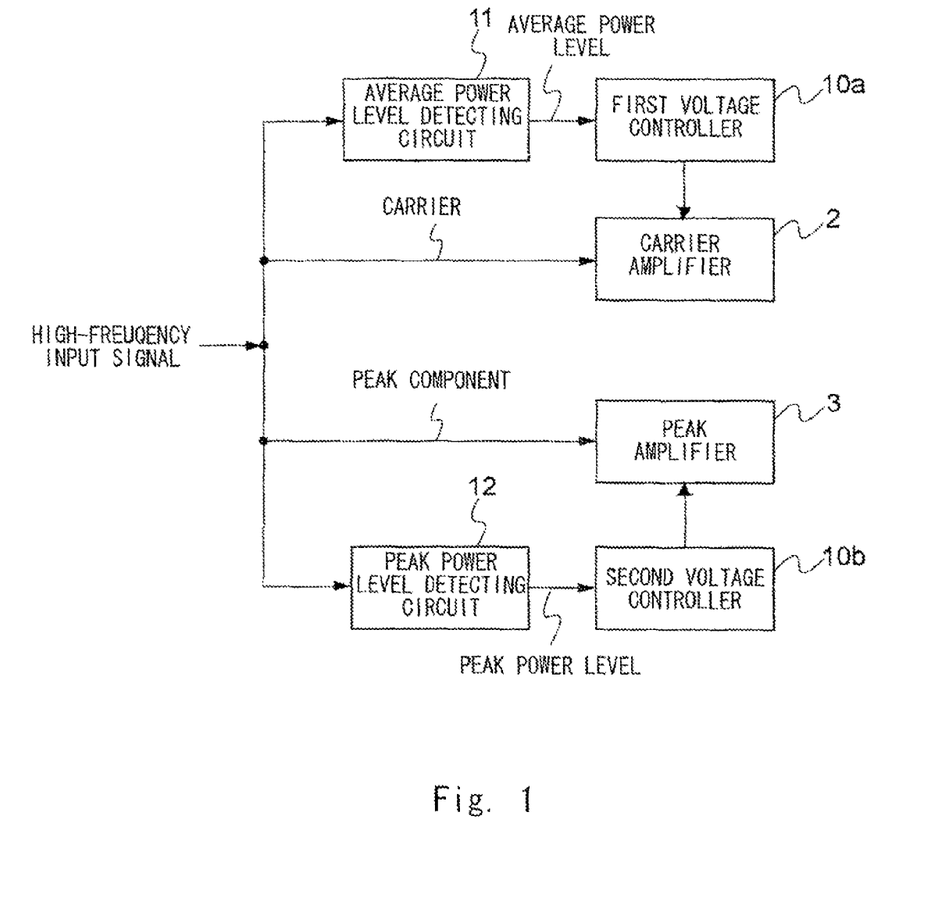
FIG. 1 is a block diagram of an exemplary power amplifier illustrating the operating principle of the present invention.

Prior to explanation of exemplary embodiments of the present invention, the operating principle of the present invention will be first described. FIG. 1 is a block diagram showing an exemplary power amplifier illustrating the operating principle of the present invention. Referring to FIG. 1, an exemplary power amplifier according to the present invention includes a carrier amplifier 2 that amplifies a carrier of a high-frequency input signal; a peak amplifier 3 that amplifies a peak component of the high-frequency input signal; an average power level detecting circuit 11 that detects an average power level of the high-frequency input signal; and a peak power level detecting circuit 12 that detects a peak power level of the high-frequency input signal.

The exemplary power amplifier according to the present invention also includes a first voltage controller 10a that controls a DC voltage supplied to the carrier amplifier 2 according to an output voltage signal from the average power level detecting circuit 11; and a second voltage controller 10b that controls a DC voltage supplied to the peak amplifier 3 according to an output voltage signal from the peak power level detecting circuit 12.

In the power amplifier according to the present invention, the average power level detecting circuit 11 detects the average power level of the high-frequency input signal, and the peak power level detecting circuit 12 detects the peak power level of the high-frequency input signal. Further, in the power amplifier according to the present invention, an optimum DC voltage according to the average power level is supplied to the carrier amplifier 2 through the first voltage controller 10a, and an optimum DC voltage according to the peak power level is supplied to the peak amplifier 3 through the second voltage controller 10b. This permits the power amplifier to constantly operate at an operating point of an optimum efficiency peak, without depending on the input signal level and the signal peak factor.

Figure 2:
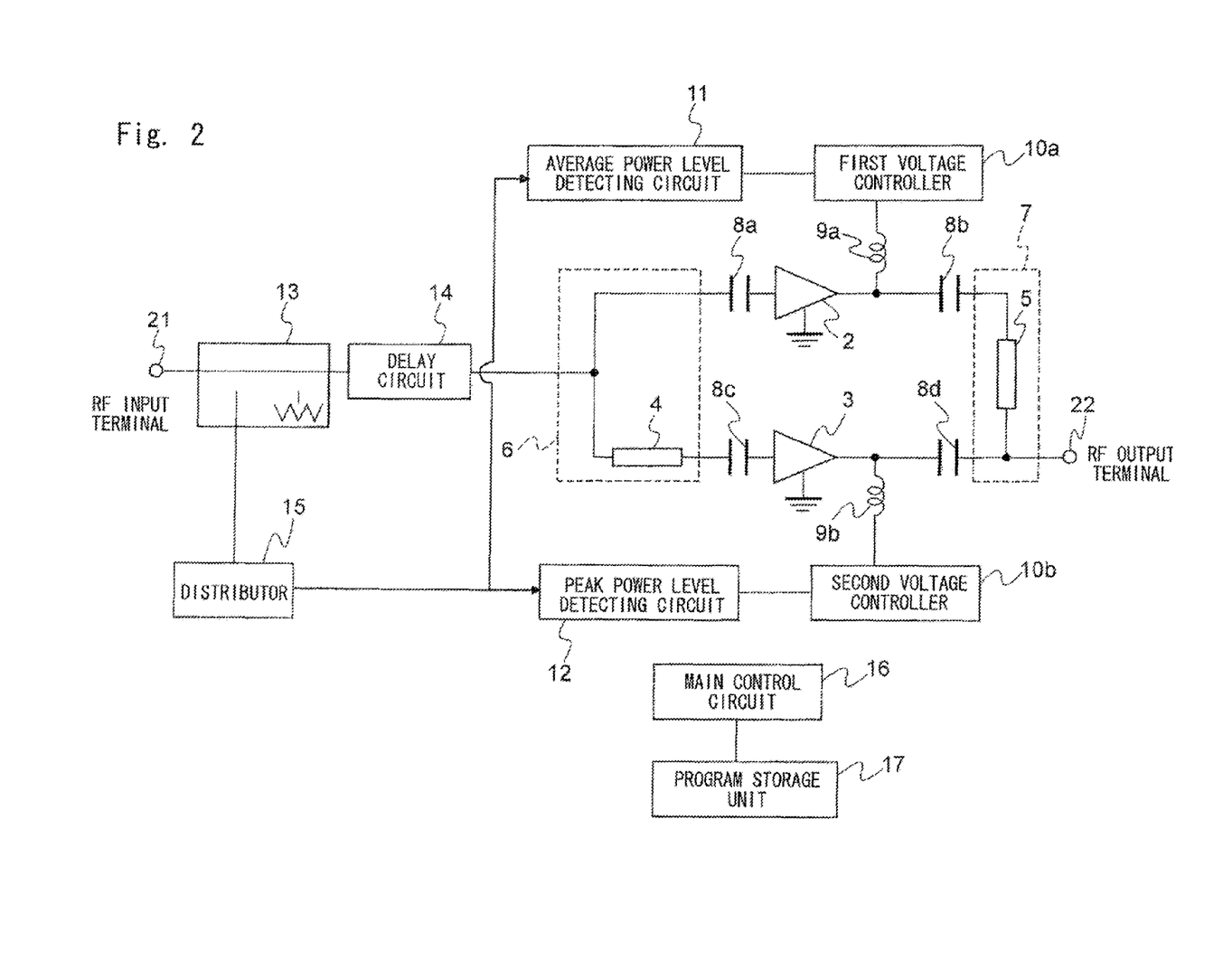
FIG. 2 is a block diagram of a first exemplary embodiment of a power amplifier according to the present invention.

Hereinafter, exemplary embodiments of the present invention will be described with reference to the accompanying drawings. First, a first exemplary embodiment will be described. FIG. 2 is a block diagram showing the first exemplary embodiment of the power amplifier according to the present invention. Note that components similar to those of the Doherty amplifier shown in FIG. 6 are denoted by the same reference numerals, and the description thereof is omitted.

Referring to FIG. 2, the power amplifier according to the present invention includes an RF input terminal 21 that receives an RF signal; a directional coupler 13 that extracts a part of the RF signal received from the RF input terminal 21; and a delay circuit 14 that receives a main signal output from the directional coupler 13.

The power amplifier also includes an input branch circuit 6 that branches an output signal of the delay circuit 14 into two signals; a DC decoupling capacitor 8a that receives one of the signals branched by the input branch circuit 6; a carrier amplifier 2 that receives an output signal of the DC decoupling capacitor 8a; and a DC decoupling capacitor 8b that receives an output signal of the carrier amplifier 2.

Further, the power amplifier includes a DC decoupling capacitor 8c that receives the other of the signals branched by the input branch circuit 6; a peak amplifier 3 that receives an output signal of the DC decoupling capacitor 8c; a DC decoupling capacitor 8d that receives an output signal of the peak amplifier 3; an output combiner circuit 7 that combines outputs of the DC decoupling capacitors 8b and 8d; and an RF output terminal 22.

Furthermore, the power amplifier includes a distributor 15 that distributes a part (extracted signal) of the RF signal extracted from the directional coupler 13; the average power level detecting circuit 11 that receives one of the distributed signals from the distributor 15; the first voltage controller 10a that receives an output signal of the average power level detecting circuit 11; and an RF choke coil 9a that receives an output signal of the first voltage controller 10a. An output signal of the RF choke coil 9a is supplied to the carrier amplifier 2 as a power supply voltage.

Moreover, the power amplifier includes the peak power level detecting circuit 12 that receives the other of the distributed signals from the distributor 15; the second voltage controller 10b that receives an output signal of the peak power level detecting circuit 12; and an RF choke coil 9b that receives an output signal of the second voltage controller 10b. An output signal of the RF choke coil 9b is supplied to the peak amplifier 3 as a power supply voltage.

The input branch circuit 6 is composed of a ¼ wavelength transmission line 4 or a 90-degree hybrid circuit (not shown). Similarly, the output combiner circuit 7 is composed of a ¼ wavelength transmission line 5 or a 90-degree hybrid circuit (not shown). The ¼ wavelength transmission line 4 or 90-degree hybrid circuit included in the input branch circuit 6 operates to cause the output signals of the carrier amplifier 2 and the peak amplifier 3 to be in phase at a signal combining point of the output combiner circuit 7.

The DC decoupling capacitors 8a to 8d are each composed of a capacitor having a sufficiently low impedance at the frequency of the RF signal to be used. The RF choke coils 9a and 9b are used to inhibit high-frequency signals. The directional coupler 13 extracts a part of the signal received from the RF input terminal 21, and outputs the extracted signal to the distributor 15 and the remaining signal to the delay circuit 14 as the main signal.

The average power level detecting circuit 11 detects the average power level of the input signal. The first voltage controller 10a supplies an optimum power supply voltage to the carrier amplifier 2 based on the output signal from the average power level detecting circuit 11. The peak power level detecting circuit 12 detects the peak power level of the input signal. The second voltage controller 10b supplies an optimum power supply voltage to the peak amplifier 3 based on the output signal from the peak power level detecting circuit 12.

The delay circuit 14 sets the amount of delay so that a time for the main signal output from the directional coupler 13 to be input to each of the carrier amplifier 2 and the peak amplifier 3, the amount of delay due to processing of the average power level detecting circuit 11 and the first voltage controller 10a, and the amount of delay due to processing of the peak power level detecting circuit 12 and the second voltage controller 10b match each other.

A main control circuit 16 controls at least the average power level detecting circuit 11, the first voltage controller 10a, the peak power level detecting circuit 12, and the second voltage controller 10b. A program storage unit 17 stores programs for implementing a power amplification method described later. Note that the configuration and operation of the main control circuit 16 and the program storage unit 17 will be described later.

Figure 3:
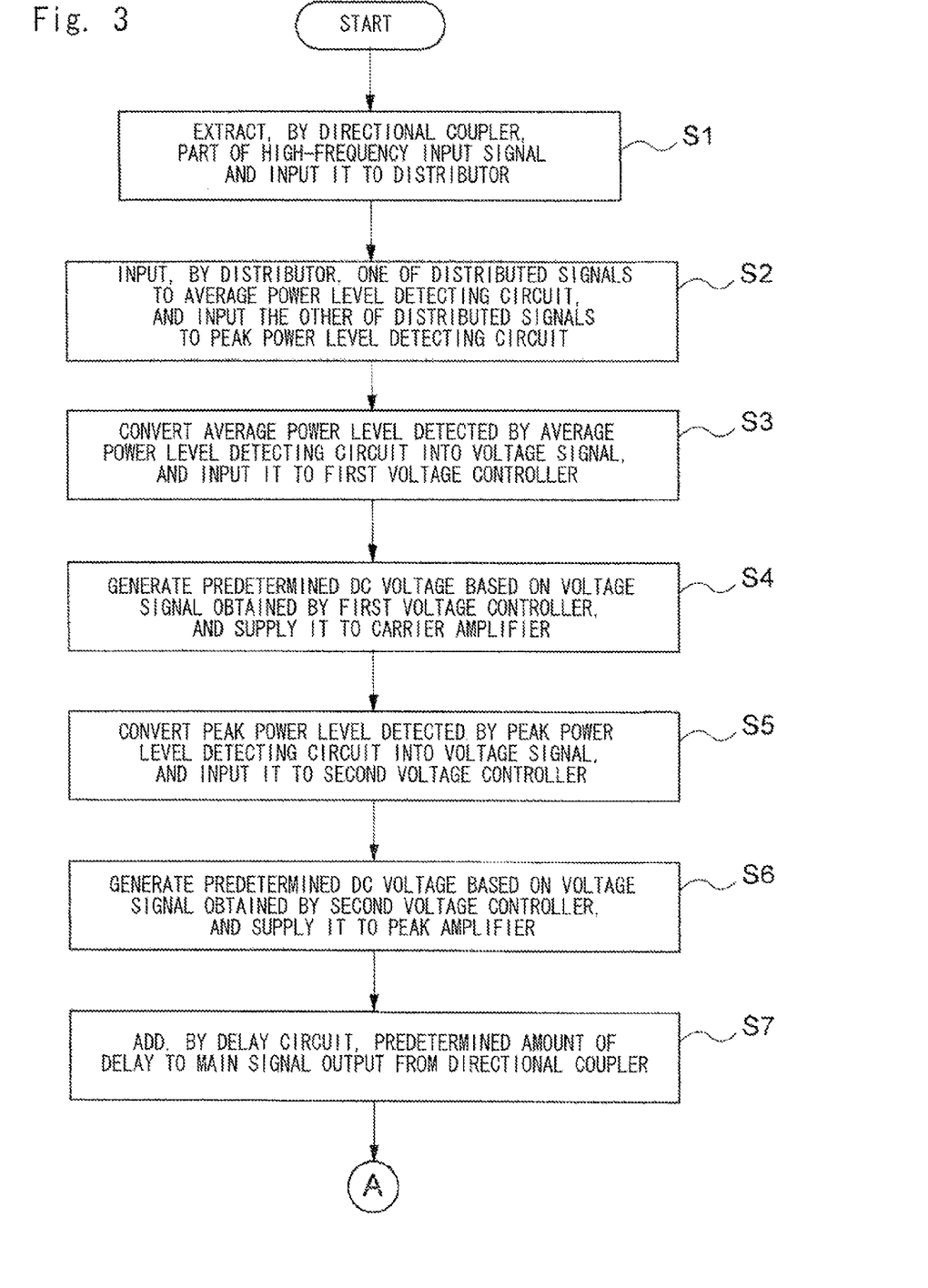
FIG. 3 is a flowchart showing an exemplary operation of the power amplifier according to the present invention.
Figure 4:
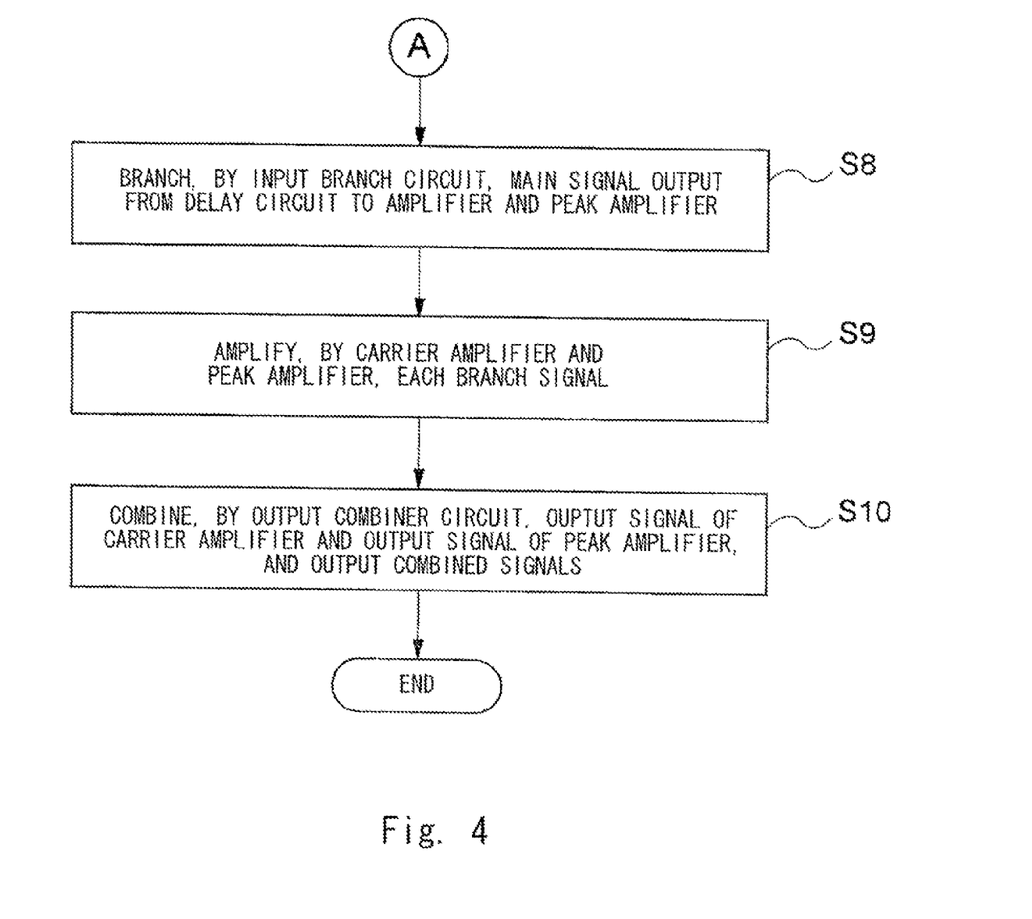
FIG. 4 is a flowchart showing an exemplary operation of the power amplifier according to the present invention.

Referring next to FIGS. 2 to 4, an exemplary operation of the power amplifier will be described. FIGS. 3 and 4 are flowcharts each showing an exemplary operation of the power amplifier according to the present invention. Note that the main control circuit 16 mainly controls the average power level detecting circuit 11, the first voltage controller 10a, the peak power level detecting circuit 12, and the second voltage controller 10b, thereby implementing the following processing.

First, a part of the high-frequency input signal from the RF input terminal 21 is extracted by the directional coupler 13 and is input to the distributor 15 (step S1). Next, one of the signals, the levels of which are equally distributed by the distributor 15, is input to the average power level detecting circuit 11, and the other of the distributed signals is input to the peak power level detecting circuit 12 (step S2).

Next, by the control of the main control circuit 16, the average power level of a part of the input signal detected by the average power level detecting circuit 11 is converted into a voltage signal and input to the first voltage controller 10a (step S3). By the control of the main control circuit 16, in the first voltage controller 10a, an optimum DC voltage is generated as a supply voltage to the carrier amplifier 2 based on the signal from the average power level detecting circuit 11. Then, the DC voltage is supplied to the carrier amplifier 2 through the RF choke coil 9a (step S4).

Meanwhile, by the control of the main control circuit 16, the peak power level of a part of the input signal detected by the peak power level detecting circuit 12 is converted into a voltage signal and input to the second voltage controller 10*b* (step S5). By the control of the main control circuit 16, in the second voltage controller 10*b*, an optimum DC voltage is generated as a supply voltage to the peak amplifier 3 based on the signal from the peak power level detecting circuit 12. Then, the DC voltage is supplied to the peak amplifier 3 through the RF choke coil 9*a* (step S6).

Next, the delay circuit 14 sets the amount of delay so that a time for the main signal output from the directional coupler 13 to be input to each of the carrier amplifier 2 and the peak amplifier 3, the amount of delay (delay time) due to processing of the average power level detecting circuit 11 and the first voltage controller 10*a*, and the amount of delay (delay time) due to processing of the peak power level detecting circuit 12 and the second voltage controller 10*b* match each other (step S7).

Next, the main signal output from the delay circuit 14 is branched and input to the carrier amplifier 2 and the peak amplifier 3 by the input branch circuit 6 (step S8). Then, the branch signals are amplified in the carrier amplifier 2 and the peak amplifier 3 (step S9). Lastly, the output signal of the carrier amplifier 2 and the output signal of the peak amplifier 3 are combined by the output combiner circuit 7 and output through the RE output terminal 22 (step S10).

Note that, for ease of explanation, an example in which the processes of steps S7 to S10 are carried out after the processes of steps S1 to S6 is described above. However, the sequence of the processes is not limited thereto. The processes of steps S7 to S10 may be carried out first. Alternatively, the processes of steps S1 to S6 and the processes of steps S7 to S10 may be executed simultaneously.

Figure 5:
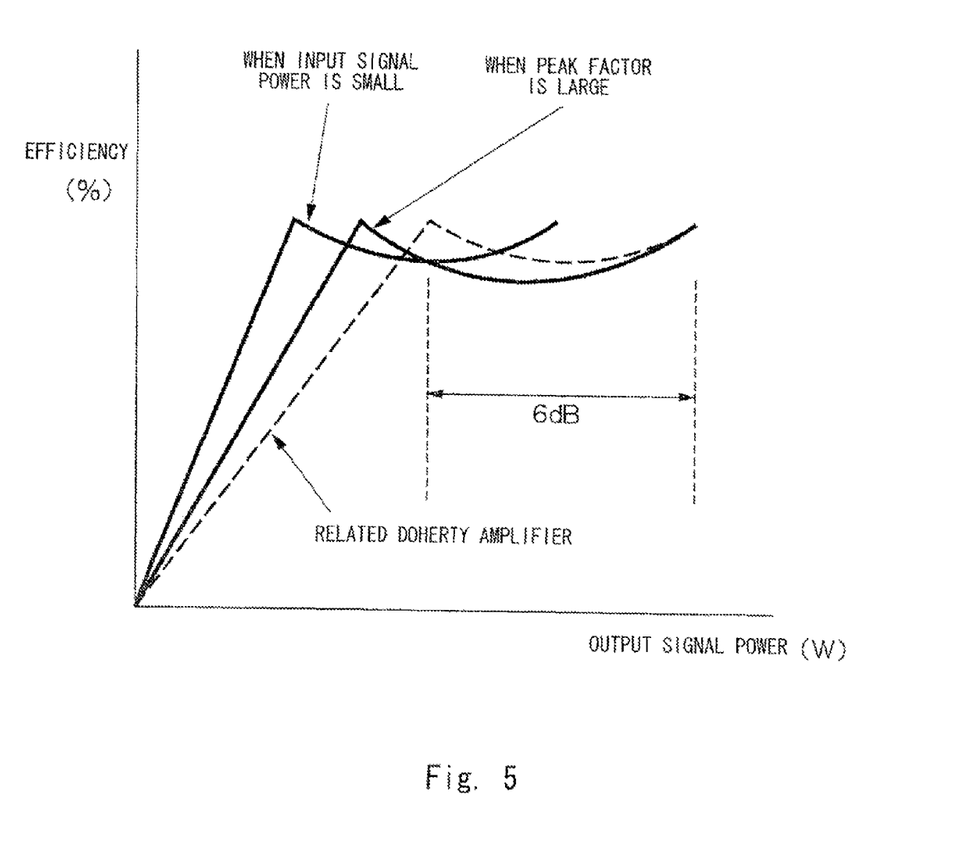
FIG. 5 is a graph showing an example of efficiency versus output signal power characteristics of a power amplifier with a Doherty amplifier configuration.

FIG. 5 is a graph showing an example of efficiency versus output signal power characteristics of the power amplifier with a Doherty amplifier configuration according to the present invention. In FIG. 5, solid lines represent the characteristics of a Doherty amplifier according to the present invention, and a dashed line represents the characteristics of a related Doherty amplifier.

Referring to FIG. 5, in the Doherty amplifier according to the present invention, when the input signal power is relatively small, the DC voltage supplied to the carrier amplifier 2 is relatively low. Accordingly, at a point where the output signal power is relatively small, the carrier amplifier 2 is saturated and shows an efficiency peak. Meanwhile, when the peak factor of the input signal is relatively large, the DC voltage supplied to the carrier amplifier 2 is relatively lower than the DC voltage supplied to the peak amplifier 3. Accordingly, at a point of a relatively large backoff from the saturated power, the carrier amplifier 2 shows an efficiency peak.

As described above, according to the first exemplary embodiment of the present invention, an optimum DC voltage is constantly supplied to each of the carrier amplifier 2 and the peak amplifier 3 without depending on the average power level of the input signal and the peak factor which is a ratio of the peak power level to the average power level. This permits the Doherty amplifier to constantly operate at the maximum efficiency point and to perform a high-efficiency operation.

In summary, a first effect is that even when modulated signals having different peak factors are input, the power supply voltage supplied to each of the carrier amplifier and the peak amplifier is optimized depending on the modulated signals, thereby enabling the power amplifier to constantly operate with high efficiency.

A second effect is that even under conditions where the amount of traffic is small and the power amplifier is not operating at the maximum signal power, the power supply voltage supplied to each of the carrier amplifier and the peak amplifier according to the signal power level is optimized, thereby enabling the power amplifier to constantly operate with high efficiency.

In the present invention, a bias voltage necessary for amplification of an average power detected by the average power level detecting circuit is independently applied to the carrier amplifier, and a bias voltage necessary for amplification of a peak power detected by the peak power level detecting circuit is independently applied to the peak amplifier.

Therefore, in the present invention, a relatively low voltage is applied to the carrier amplifier in which a current flows for a relatively long time, and a relatively high voltage is applied to the peak amplifier in which a current flows for a relatively short time. As a result, high efficiency can be achieved.

Thus, the present invention has an object of optimizing a drain (output bias). On the other hand, the technique disclosed in Patent Literature 3 has an object of optimization and application of a gate (input) bias. Therefore, the object and configuration of the present invention are quite different from those of the technique disclosed in Patent Literature 3.

In the present invention, in place of a detector for detecting an envelope of an input signal, two components, i.e., the average power level detecting circuit that detects an average power of an input signal as a level detecting circuit and the peak power level detecting circuit that detects a peak power are provided. Accordingly, in the present invention, there is no need to detect an envelope, resulting in simplification of the configuration and reduction in costs of the detecting circuits.

Furthermore, the voltage detected by the average power level detecting circuit and output from the voltage controller is not an AC voltage that follows an envelope, but a DC voltage necessary for the carrier amplifier to amplify the input average power. Similarly, the voltage detected by the peak level detection circuit and output from the voltage controller is also not an AC voltage that follow an envelope, but a DC voltage necessary for the peak amplifier to amplify the input peak power.

Therefore, in the present invention, simplification and reduction in costs of the circuit can be achieved compared to the technique disclosed in Patent Literature 4 in which a voltage control circuit that follows an envelope is applied. Accordingly, a high-efficiency amplifier can be achieved. Hence, the configuration of the present invention is quite different from that of the technique disclosed in Patent Literature 4.

Next, a second exemplary embodiment of the present invention will be described. The second exemplary embodiment relates to a program for implementing a power amplification method. As described above, the power amplifier according to the present invention includes the main control circuit 16 and the program storage unit 17 (see FIG. 2).

The program storage unit 17 stores programs for at least processes related to the control of the main control circuit 16 ("computer") among the processes (S1 to S10) shown in the flowcharts of FIGS. 3 and 4. The processes related to the control of the main control circuit 16 ("computer") correspond to steps S3 to S6 of FIG. 3, which are steps for the main control circuit 16 to control the average power level detecting circuit 11, the first voltage controller 10*a*, the peak power level detecting circuit 12, and the second voltage controller 10*b*.

The main control circuit 16 reads out programs shown in steps S3 to S6 of FIG. 3 from the program storage unit 17, and controls the average power level detecting circuit 11, the first voltage controller 10*a*, the peak power level detecting circuit 12, and the second voltage controller 10b. The contents of the control have been described above, so the description thereof is herein omitted.

As described above, according to the second exemplary embodiment of the present invention, it is possible to obtain a program for implementing a power amplification method that allows a constant high-frequency operation without depending on the type of the input signal and the input signal power level.

As exemplary embodiments of the present invention, the application to a power amplifier that handles signals having a relatively large peak factor, such as W-CDMA modulation wave or OFDMA modulation wave, is exemplified. To the contrary, a power amplifier that handles signals having a relatively small peak factor may be optimized by setting the power supply voltage supplied to the peak amplifier to be lower than the power supply voltage supplied to the carrier amplifier.

This application is the National Phase of PCT/JP2009/005187, filed Oct. 6, 2009, which is based upon and claims the benefit of priority from Japanese patent application No. 2008-283806, filed on Nov. 5, 2008, the disclosure of which is incorporated herein in its entirety by reference.

INDUSTRIAL APPLICABILITY

The present invention is applicable to a wide range of technical fields including communication devices using techniques such as W-CDMA or OFDMA modulation wave.

REFERENCE SIGNS LIST

2 CARRIER AMPLIFIER
3 PEAK AMPLIFIER
4 ¼ WAVELENGTH TRANSMISSION LINE
5 ¼ WAVELENGTH TRANSMISSION LINE
6 INPUT BRANCH CIRCUIT
7 OUTPUT COMBINER CIRCUIT
8a, 8b DC DECOUPLING CAPACITOR
8c, 8d DC DECOUPLING CAPACITOR
9a, 9b RF CHOKE COIL
10a FIRST VOLTAGE CONTROLLER
10b SECOND VOLTAGE CONTROLLER
11 AVERAGE POWER LEVEL DETECTING CIRCUIT
12 PEAK POWER LEVEL DETECTING CIRCUIT
13 DIRECTIONAL COUPLER
14 DELAY CIRCUIT
15 DISTRIBUTOR
16 MAIN CONTROL UNIT
17 PROGRAM STORAGE UNIT
21 RF INPUT TERMINAL
22 RF OUTPUT TERMINAL

The invention claimed is:

1. A power amplifier comprising:
a directional coupler that branches a part of a high-frequency input signal;
a delay circuit that receives a main signal output from the directional coupler and adds a predetermined amount of delay;
an input branch circuit that branches an output signal of the delay circuit into two output signals, inputs one of the output signals to a carrier amplifier, and branches the other of the output signals to a peak amplifier;
the carrier amplifier that amplifies a carrier of the one output signal output from the input branch circuit;
the peak amplifier that amplifies a peak component of the other output signal output from the input branch circuit;
an average power level detecting circuit that detects an average power level of the high-frequency input signal;
a peak power level detecting circuit that detects a peak power level of the high-frequency input signal;
a first voltage controller that controls a DC voltage supplied to the carrier amplifier according to an output voltage signal from the average power level detecting circuit; and
a second voltage controller that controls a DC voltage supplied to the peak amplifier according to an output voltage signal from the peak power level detecting circuit.

2. The power amplifier according to claim 1, comprising:
a distributor that receives a branch signal branched by the directional coupler, and distributes the branch signal to the average power level detecting circuit and the peak power level detecting circuit; and
an output combiner circuit that combines an output signal of the carrier amplifier with an output signal of the peak amplifier.

3. The power amplifier according to claim 2, wherein the delay circuit sets an amount of delay so that a time for the main signal output from the directional coupler to be input to each of the carrier amplifier and the peak amplifier, an amount of delay due to processing of the average power level detecting circuit and the first voltage controller, and an amount of delay due to processing of the peak power level detecting circuit and the second voltage controller match each other.

4. The power amplifier according to claim 2, wherein the input branch circuit comprises one of a ¼ wavelength transmission line and a 90-degree hybrid circuit that causes output signals of the carrier amplifier and the peak amplifier to be in phase at a signal combining point of the output combiner circuit.

5. The power amplifier according to claim 2, wherein the output combiner circuit comprises a ¼ wavelength transmission line.

6. The power amplifier according to claim 3, wherein the input branch circuit comprises one of a ¼ wavelength transmission line and a 90-degree hybrid circuit that causes output signals of the carrier amplifier and the peak amplifier to be in phase at a signal combining point of the output combiner circuit.

7. The power amplifier according to claim 3, wherein the output combiner circuit comprises a ¼ wavelength transmission line.

8. A power amplification method comprising:
detecting an average power level of a high-frequency input signal;
detecting a peak power level of the high-frequency input signal;
controlling a DC voltage supplied to a carrier amplifier that amplifies a carrier according to an output voltage signal detected when the average power level is detected; and
controlling a DC voltage supplied to a peak amplifier that amplifies a peak component according to an output voltage signal detected when the peak power level is detected.

9. The power amplification method according to claim 8, comprising:
branching a part of the high-frequency input signal;
inputting a main signal output when a part of the high-frequency input signal is branched, and adding a predetermined amount of delay;
branching an output signal which is added the predetermined amount of delay into two output signals, inputting one of the output signals to the carrier amplifier, and inputting the other of the output signals to the peak amplifier;

detecting an average power level of the high-frequency input signal and a peak power level of the high-frequency input signal based on a branch signal output when a part of the high-frequency input signal is branched; and combining an output signal of the carrier amplifier with an output signal of the peak amplifier.

10. The power amplification method according to claim 9, wherein upon adding the predetermined delay, a delay is added so that a time for a main signal output when a part of the high-frequency input signal is branched to be input to each of the carrier amplifier and the peak amplifier, an amount of delay due to detection of the average power level of the high-frequency input signal and control of the DC voltage supplied to the carrier amplifier, and an amount of delay due to detection of the peak power level of the high-frequency input signal and control of the DC voltage supplied to the peak amplifier match each other.

11. The power amplification method according to claim 9, wherein when a part of the high-frequency input signal is branched, output signals of the carrier amplifier and the peak amplifier are set to be in phase at a signal combining point of the output signals, by using one of a ¼ wavelength transmission line and a 90-degree hybrid circuit.

12. The power amplification method according to claim 9, wherein upon combining an output signal of the carrier amplifier with an output signal of the output signal, the output signals are set to be in phase at a signal combining point, by using a ¼ wavelength transmission line.

13. The power amplification method according to claim 10, wherein when a part of the high-frequency input signal is branched, output signals of the carrier amplifier and the peak amplifier are set to be in phase at a signal combining point of the output signals, by using one of a ¼ wavelength transmission line and a 90-degree hybrid circuit.

14. The power amplification method according to claim 10, wherein upon combining an output signal of the carrier amplifier with an output signal of the output signal, the output signals are set to be in phase at a signal combining point, by using a ¼ wavelength transmission line.

* * * * *